(12) United States Patent
Darabl (10) Patent No.: US 6,889,037 B2
(45) Date of Patent: May 3, 2005

(54) REDUCING ACTIVE MIXER FLICKER NOISE

(75) Inventor: Hooman Darabl, Long Beach, CA (US)

(73) Assignee: Broadcom Corporation, Irvine, CA (US)

(*) Notice: Subject to any disclaimer, the term of this patent is extended or adjusted under 35 U.S.C. 154(b) by 423 days.

(21) Appl. No.: 10/224,039

(22) Filed: Aug. 20, 2002

(65) Prior Publication Data

US 2004/0038662 A1 Feb. 26, 2004

(51) Int. Cl.[7] .................................................. H04B 1/26
(52) U.S. Cl. ...................... 455/323; 455/293; 455/326; 455/333; 327/116; 327/386; 330/254
(58) Field of Search .............................. 455/338, 325, 455/323, 333, 334, 293, 295, 296, 311, 313, 319, 326, 130, 131, 189.1, 190.1; 327/113.4, 35.6, 116, 359, 119–122, 397; 297/446, 449; 330/294, 278

(56) References Cited

U.S. PATENT DOCUMENTS

| | | | |
|---|---|---|---|
| 6,184,739 B1 * | 2/2001 | Doyle | 327/359 |
| 6,525,609 B1 * | 2/2003 | Behzad | 330/254 |
| 6,684,065 B2 * | 1/2004 | Bult et al. | 455/252.1 |
| 6,759,904 B2 * | 7/2004 | Behzad | 330/254 |
| 2002/0004376 A1 * | 1/2002 | Lee et al. | 455/326 |
| 2004/0227559 A1 * | 11/2004 | Erba et al. | 327/356 |

* cited by examiner

Primary Examiner—Pablo N. Tran
(74) Attorney, Agent, or Firm—Garlick Harrison & Markison LLP; James A. Harrison (57) ABSTRACT

A mixer is disclosed that includes first and second transconductance modules that, in one embodiment, includes MOSFETs configured to receive a plurality of signals that are to be mixed and a selectively coupled auxiliary current source to inject an auxiliary current into the second transconductance module approximately at or near a zero-crossing point in order to reduce flicker noise and other noise introduced into an output signal during switching. Accordingly, as a first transconductance module approaches a zero-crossing, auxiliary current is injected to reduce the current produced therefrom thereby reducing flicker noise. In a differential mixer, the amount of current produced from a transistor pair to which the signal cycle is being switched is also reduced thereby reducing noise from the transistor pair that is turning on for the next portion of a signal cycle.

10 Claims, 9 Drawing Sheets

FIG. 3
down-conversion module 70

FIG. 4
mixer 100, 102

FIG. 5

FIG. 6
mixer 100, 102

FIG. 7
mixer 100, 102

REDUCING ACTIVE MIXER FLICKER NOISE

TECHNICAL FIELD OF THE INVENTION

This invention relates generally to wireless communication systems and, more particularly, to radio frequency integrated circuits used in such wireless communication systems.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and the intermediate frequency signals. A filtering stage filters the low IF signals to attenuate unwanted out of band signals to produce a filtered signal. The data recovery stage recovers raw data from to the filtered signal in accordance with the particular wireless communication standard.

More specifically, the one or more intermediate frequency stages that mix the amplified RF signal with one or more local oscillations to convert the amplified RF signal into a baseband signal or an intermediate frequency signal often utilize CMOS-based mixer designs. One problem that is known for CMOS-based mixers, however, is that flicker noise (1/f) appears at the output of the mixer even though the output loads are free of flicker noise. In general, flicker noise significantly increases in magnitude as a frequency approaches 0 Hz (DC). For some communication systems, the effects of flicker noise are insignificant because the systems operate at higher frequencies. For other communication systems, for example, GSM systems, flicker noise is significant. In some cases, the flicker noise is sufficiently significant that particular mixer designs cannot be readily used.

Active mixers typically comprise input transconductance elements, switches and an output load. Many of these components are formed with noisy transistors. The loads, as well as the transconductance elements (field effect transistors), generate both flicker noise and white noise. MOSFET devices also generate noise during switching. As a differential pair of a mixer switches from one side to the other side, for example, a skew in the switching instant modulates a differential current waveform at the mixer output. This skew retards the timing of the zero-crossing by the local oscillation differential voltage. Thus, a low frequency noise at the gate of the input switch appears at the output without frequency translation and therefore corrupts a signal that is down converted from RF to baseband or to a low IF signal. What is needed, therefore, is a mixer for use in CMOS radio transceiver circuits that reduces or eliminates the effects of flicker noise and, more generally, noise from switching, especially for transceivers that operate at low frequencies.

SUMMARY OF THE INVENTION

A radio transceiver includes mixer circuitry within a receiver portion that reduces or eliminates flicker noise that is produced by the switch circuitry within the mixer circuitry. More specifically, the radio receiver includes a first mixer for mixing amplified RF signals with an I component of a local oscillation to produce a first mixed result; and a second mixer for mixing the amplified RF with a Q component of a local oscillation to produce a second mixed result. Each of the first and second mixers further comprises first and second transconductance modules wherein the first transconductance module receives large signal inputs of a local oscillation and the second transconductance module receives filtered components for mixing with the local oscillation. The mixers further include at least one auxiliary current module that is coupled to provide a current to the second transconductance module during switching of at least a portion of the first transconductance module. Stated differently, the auxiliary current module provides a current that is sourced into the second transconductance module at or near a zero-crossing of the signal received by the first transconductance module. As such, the current that is sourced by the at least one auxiliary current module reduces or eliminates any flicker noise that would otherwise be produced by the first transconductance module at or near a zero-crossing.

The at least one current source, in one embodiment of the invention, includes two current sources, one for each of a pair of small signal inputs of the second transconductance module. In each of the embodiments, where one or more auxiliary current modules are utilized, the current module may comprise a current source, a MOSFET coupled and biased to act as a resistor that, in turn, is coupled to a supply voltage, a resistor that is coupled to a supply voltage, or any combination thereof.

Additionally, the auxiliary current module coupled to the second transconductance module, in the described embodiment of the invention, by coupling circuitry. In one embodiment of the invention, the coupling circuitry comprises a p-channel MOSFET that is operatively biased at or near the zero-crossing points. Stated differently, a gate terminal of the p-channel MOSFET is coupled to receive a bias signal that operatively biases the p-channel MOSFET approximately during switching. As such, the coupling circuitry couples the current source(s) at or near switching to effectively reduce or eliminate flicker noise thereby providing better output signal quality.

DETAILED DESCRIPTION OF A PREFERRED EMBODIMENT

Figure 1:
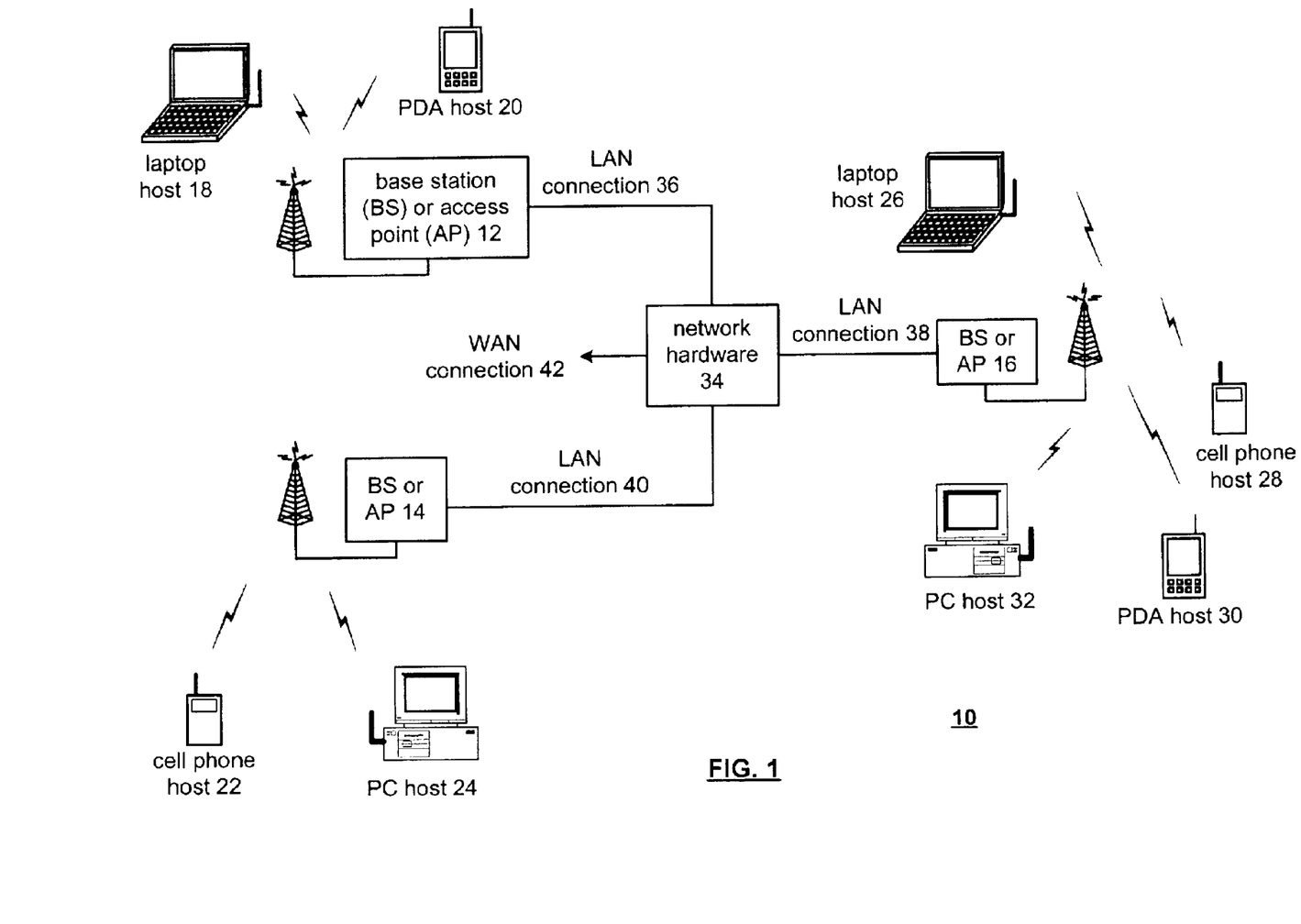
FIG. 1 is a schematic block diagram illustrating a communication system that includes a plurality of base stations and/or access points, a plurality of wireless communication devices and a network hardware component.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware component 34 via local area network connections 36, 38 and 40. The network hardware component 34, which may be a router, switch, bridge, modem, system controller, etc., provides a wide area network connection 42 for the communication system 10. Each of the base stations or access points 12–16 has an associated antenna or antenna array to communicate with the wireless communication devices in its area. Typically, the wireless communication devices 18–32 register with the particular base station or access points 12–16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier to enhance performance, reduce costs, reduce size, and/or enhance broadband applications.

Figure 2:
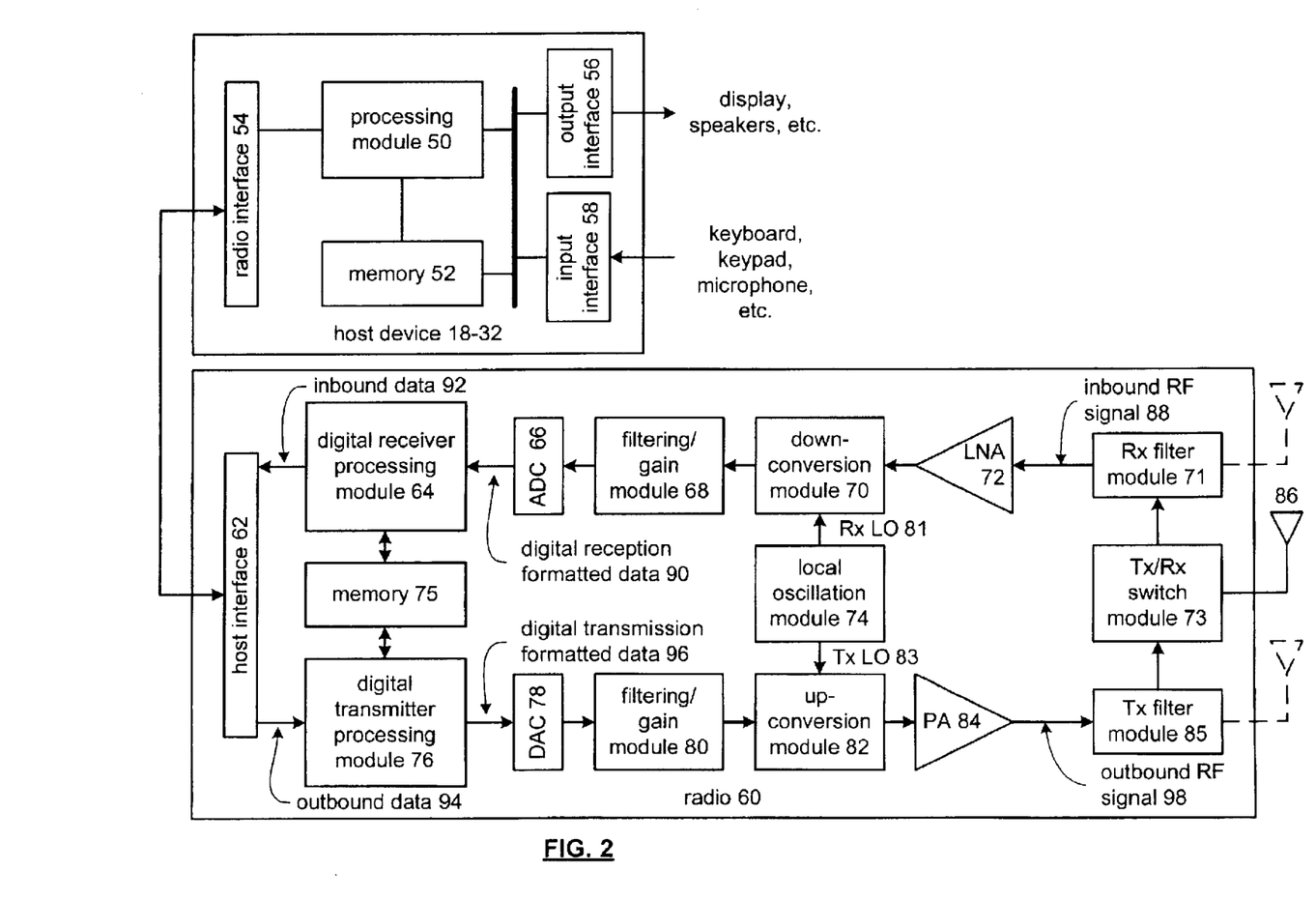
FIG. 2 is a schematic block diagram illustrating a wireless communication device as a host device and an associated radio.

FIG. 2 is a schematic block diagram illustrating a wireless communication device 18–32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18–32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, an IF mixing down-conversion module 70, a receiver filter module 71, a low noise amplifier 72, a transmitter/receiver (Tx/RX) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 may be a single antenna that is shared by the transmit and receive paths as regulated by the Tx/Rx switch module 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transceiver processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transceiver processing module 76 executes, operational instructions corresponding to at least some of the functions illustrated in FIGS. 3–8.

In operation, the radio 60 receives outbound data 94 from the host wireless communication device 18–32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing up-conversion module 82. The IF mixing up-conversion module 82 directly converts the analog baseband, or low IF signal, into an RF signal based on a transmitter local oscillation 83 provided by local oscillation module 74. The power amplifier 84 amplifies the RF signal to produce an outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the IF mixing down-conversion module 70, which directly converts the amplified inbound RF signal into an inbound low IF signal or baseband signal based on a receiver local oscillation signal 81 provided by local oscillation module 74. The IF mixing down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver processing module 64 and the digital transceiver processing module 76 may be a common processing device implemented on a single integrated circuit. Further, memory 52 and memory 75 may be implemented on a single integrated circuit and/or on the same integrated circuit as the common processing modules of processing module 50 and the digital receiver processing module 64 and the digital transceiver processing module 76.

Figure 3:
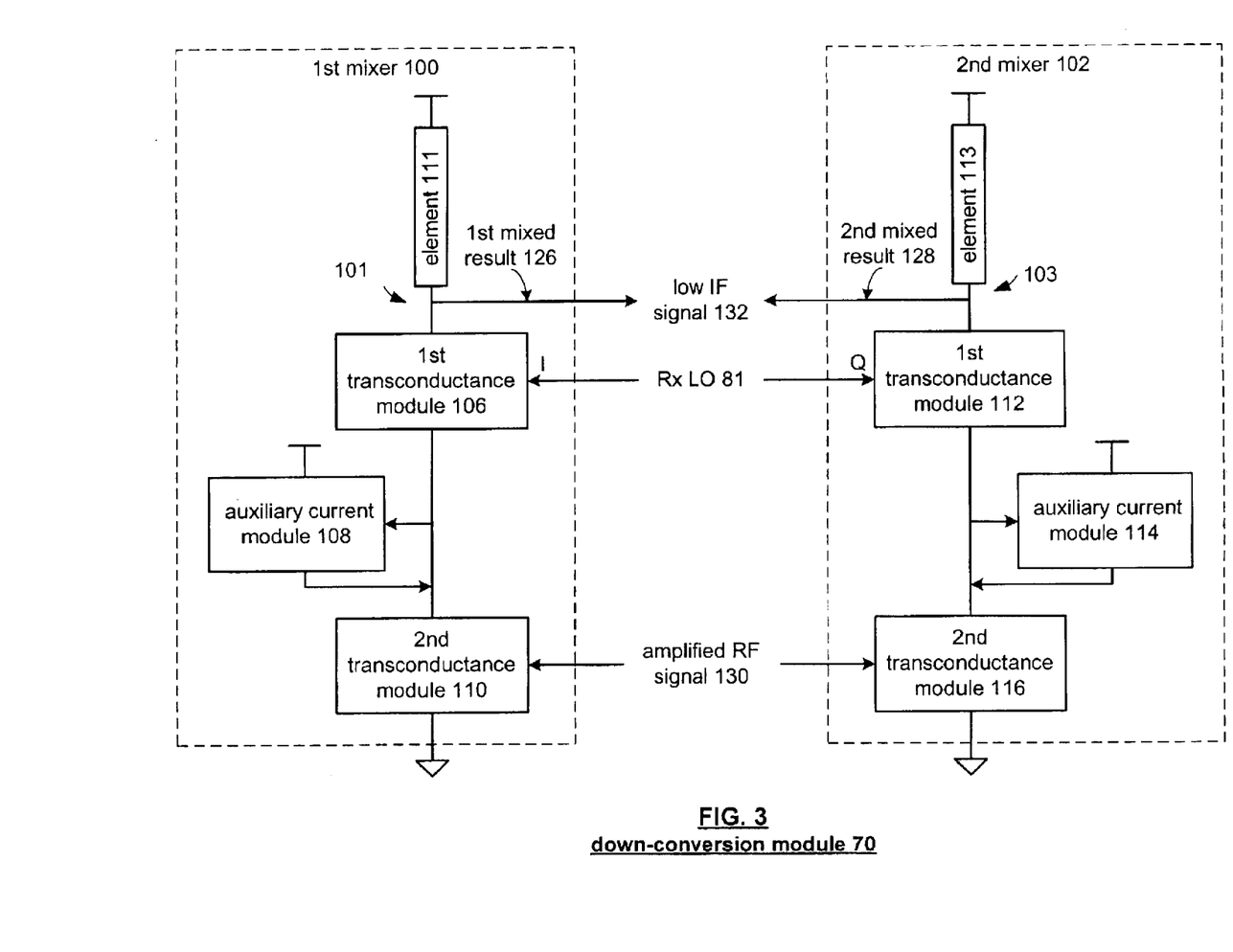
FIG. 3 is a functional block diagram of a down-conversion module formed according to one embodiment of the present invention.

FIG. 3 is a functional block diagram illustrating a down-conversion module 70, as shown in FIG. 2. The down-conversion module 70 of FIG. 3 is shown to have a first mixer 100 and a second mixer 102. First mixer 100 includes an element 111 that is coupled to a voltage source. Element 111 may be formed of a resistor, an inductor, or any other I-V module. In general, current is conducted through element 111 from a supply voltage to produce a voltage drop at a node 101. A first transconductance module 106 is further coupled downstream of element 111 and, more specifically, is coupled to node 101. A second transconductance module 110 is farther coupled to first transconductance module 106. An auxiliary current module 108 is coupled to monitor a signal between first transconductance module 106 and second transconductance module 110 and, as described herein, to produce a current for a temporary period to second transconductance module 110 thereby reducing the current being provided by first transconductance module 106.

Similarly, second mixer 102 comprises an element 113 that is similar to element 111 and that is also coupled to the voltage source. Element 113 further is coupled to a node 103 that, in turn, is coupled to a first transconductance module 112. First transconductance module 112 is further coupled to a second transconductance module 116. An auxiliary current module 114 is coupled to monitor signals between first transconductance module 112 and second transconductance module 116 and to inject current into second transconductance module 116 for a temporary period in a manner as described herein.

First transconductance module 106 is further coupled to receive an I component of a receiver (Rx) transmission local oscillation signal 81, while first transconductance module 112 is coupled to receive a Q component of Rx local oscillation signal 81. Referring back to FIG. 2, local oscillation module 74 is shown to produce the Rx local oscillation signal 81 to down-conversion module 70. While FIG. 2 illustrates only one signal being produced to down-conversion module 70, FIG. 3 further clarifies the configuration of FIG. 2 and shows that in a system that utilizes phase shift keyed signaling, multiple signal components, including quadrature signal components, may be produced by the local oscillation module 74. Thus, in the specific example of down-conversion module 70 shown in FIG. 3, an I component of a local oscillation and a Q component of a local oscillation is produced by local oscillation module 74 and is received by first transconductance modules 106 and 112, respectively.

The first and second mixers 100 and 102 and, more particularly, the first transconductance modules 106 and 112, mix the I and Q Rx local oscillation signals 81 with the amplified RF signal 130 (which contains both I and Q components therein) to produce a first mixed result 126 and a second mixed result 128 from nodes 101 and 103, respectively. A low IF signal 132 shown in FIG. 3 represents the down-converted I component and Q component signals. In the described embodiment of the invention, the low IF signal 132 comprises either baseband signals or low intermediate frequency signals. As before, auxiliary current modules 108 and 114 inject current into the second transconductance modules 110 and 116, respectively, at or about a switching point (zero-crossing). As will be explained in greater detail below, auxiliary current modules 108 and 114 are both coupled to a supply voltage, in the described embodiment of the invention, and are operatively biased to inject current to second transconductance modules 110 and 116 when the I or Q transmission local oscillation signals 83 approach a zero-crossing point.

Figure 4:
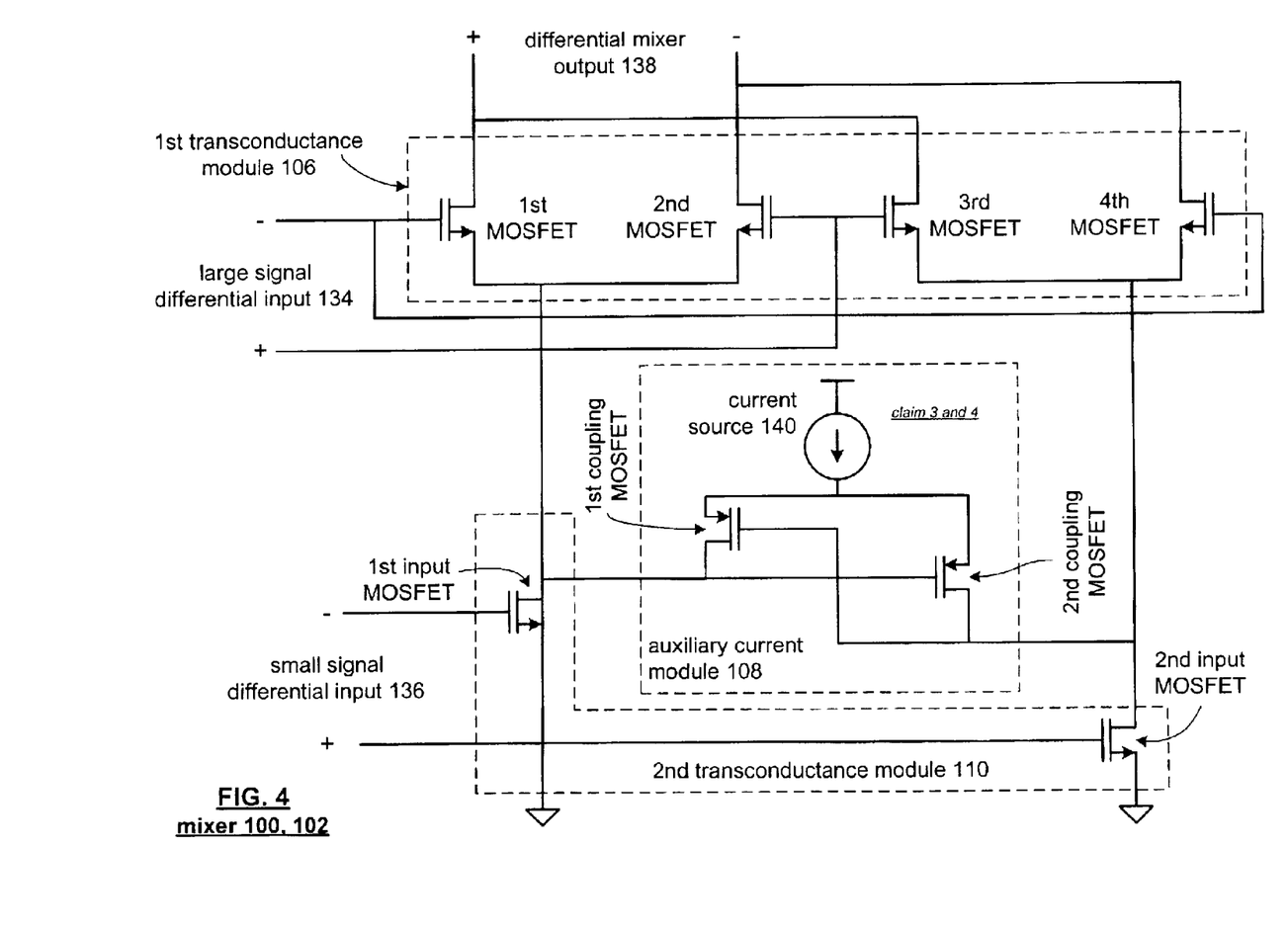
FIG. 4 is a functional schematic diagram of a mixer with one auxiliary current source formed according to one embodiment of the present invention.

FIG. 4 is a functional schematic diagram of a mixer with one auxiliary current source formed according to one embodiment of the present invention. As may be seen, the mixer of FIG. 4 includes first transconductance module 106, second transconductance module 110, and auxiliary current module 108. With respect to first transconductance module 106, a plurality of n-channel enhancement mode MOSFETs are included therein. More specifically, first and second MOSFETs include drain terminals that are coupled to an output to create a differential mixer output 138, while the source terminals of the first and second MOSFETs are coupled to each other and to a drain terminal of a first input MOSFET of the second transconductance module 110. A source terminal of the first input MOSFET is coupled to circuit common. A gate terminal of the first MOSFET of the first transconductance module 106 is coupled to receive and conduct current during one-half of a large signal differential input 134.

A gate terminal of the second MOSFET of the first transconductance module 106 is coupled to receive and conduct current during a second half of the large signal differential input 134. Similarly, the gate terminal of a third MOSFET is also coupled to the gate terminal of the second MOSFET and therefore is coupled to receive and conduct current during the second half of the large signal differential input 134. A gate terminal of a fourth MOSFET is further coupled to the gate terminal of the first MOSFET and therefore is coupled to receive and conduct current during the first half of the large signal differential input 134. The source terminals of the third and fourth MOSFETs are further coupled to a drain terminal of a second input MOSFET of the second transconductance module 110. The source terminal of the second input MOSFET is further coupled to circuit common. The drain terminals of the third and fourth MOSFETs are coupled to the drain terminals of the first and second MOSFETs, respectively, and therefore to the differential mixer output 138. The gate terminals of the first and second input MOSFETs form a small signal differential input 136.

In the described embodiment of FIG. 4, the auxiliary current module 108 comprises a current source 140 and a pair of coupling MOSFETs. More specifically, a first coupling MOSFET includes a source terminal that is coupled to receive current sourced by current source 140, as is the source terminal of a second coupling MOSFET. The first and second coupling MOSFETs further include drain terminals that are coupled to the drain terminals of the input MOSFETs. More specifically, the drain terminal of the first coupling MOSFET is coupled to the drain terminal of the first input MOSFET while the drain terminal of the second coupling MOSFET is coupled to the drain terminal of the second input MOSFET.

As may readily be seen by one of average skill in the art, both the first and second coupling MOSFETs are p-channel MOSFETs. The gate terminal of the first coupling MOSFET is coupled to the drain terminal of the second input MOSFET, while the gate terminal of the second coupling MOSFET is further coupled to the drain terminal of the first input MOSFET. As may be seen, therefore, the first and second coupling MOSFETs are operatively biased to couple the current source 140 to a drain terminal of either the first input MOSFET or the second input MOSFET during switching. In the embodiment shown herein, current source 140 is used to source current to the drain terminals of both the first input MOSFET and the second input MOSFET whenever the large signal differential input 134 is switching either from conducting current through the first and second MOSFETs to conducting current through the third and fourth MOSFETs, or vice versa.

The large signal differential input 134 is either a differential I component of a local oscillation or a differential Q component of a local oscillation. The small signal differential input 136 is an amplified RF signal 130 for the down-conversion mixer. The small signal differential input 136 is either a filtered I or Q component signal. In either case, the small signal differential inputs are biased to a DC level to provide a continuous DC biased current for the first and second MOSFETs or for the third and fourth MOSFETs of the first transconductance module 106, respectively. Finally, it should be understood that the polarity of the transistors and/or the signals may be reversed using p-channel MOSFETs for the inputs and n-channel MOSFETs for the coupling MOSFETs. In general, the coupling MOSFETs are of an opposite type to the input MOSFETs and are biased to operatively couple a current source, such as current source 140, approximately during switching.

Figure 5:
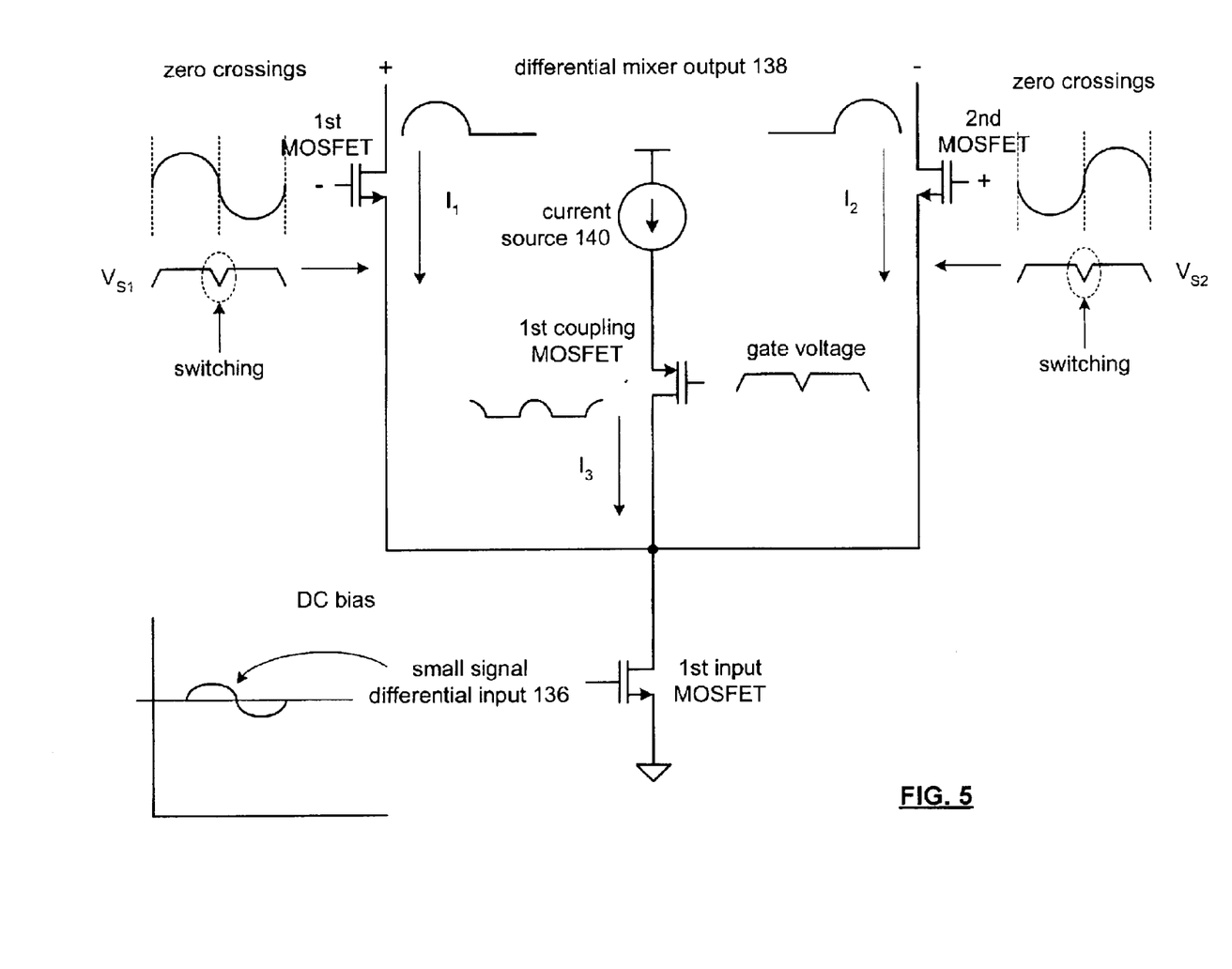
FIG. 5 is a functional schematic diagram illustrating signal responses produced by one embodiment of the present invention.

FIG. 5 is a functional schematic diagram illustrating signal responses produced by the inventive mixer disclosed herein. As may be seen, a first and second MOSFET of a transconductance module, such as transconductance modules 106, 107, 110 or 111, are coupled to receive a large signal differential input of a local oscillation. Given that the input signals are differential, they are shown here in FIG. 5 to be 180° out of phase. The current conducted through the drain terminals of the first and second MOSFETs are shown as $I_1$ and $I_2$, respectively. The waveform that corresponds to $I_1$ and $I_2$ further reflects the differential circuit operation in that the first MOSFET conducts current through a first half of a signal cycle, while the second MOSFET conducts current through a second half of the signal cycle of the large signal differential input. Because the source terminals of the first and second MOSFETs are coupled to each other, the source voltage seen at each terminal is the same, as shown here in FIG. 5, as $V_{S1}$ and $V_{S2}$.

A dashed portion in the center of the signal pattern shown for $V_{S1}$ and $V_{S2}$ indicates the switching point of the differential mixer. As was shown in FIG. 4, the gate terminal of a coupling MOSFET is coupled to the source terminals of one of the first, second, third, or fourth MOSFETs. Thus, the input signal at the gate terminal of the first coupling MOSFET is similar to the signals $V_{S1}$ and $V_{S2}$. Because the first coupling MOSFET is operatively biased to conduct current only at the switching point, as shown for $V_{S1}$ or $V_{S2}$, a current $I_3$ is conducted through the drain of the first coupling MOSFET having a waveform, as shown in FIG. 5, for $I_3$. Effectively, the first coupling MOSFET only conducts current during the switching point as shown for $V_{S1}$ and $V_{S2}$.

The flicker noise that degrades signal quality is dependent on IDS of the corresponding mixer transistor. Accordingly, reducing $I_{DS}$ ($I_1$ and $I_2$) during switching of the mixer MOSFET transistors reduces flicker noise. Thus, when the first coupling MOSFET of FIG. 5 is operatively biased to source current into the drain terminal of the first input MOSFET, the magnitude of $I_1$ and $I_2$ required to be conducted through the first and second MOSFETs of the mixer is reduced, respectively, thereby reducing flicker noise. As may also be seen, the first input MOSFET is coupled to receive a small signal differential input superimposed upon a DC bias signal. Thus, the DC bias signal operatively biases the first and second MOSFETs and the small signal differential input is mixed with the large signal inputs of the first and second MOSFETs.

Figure 6:
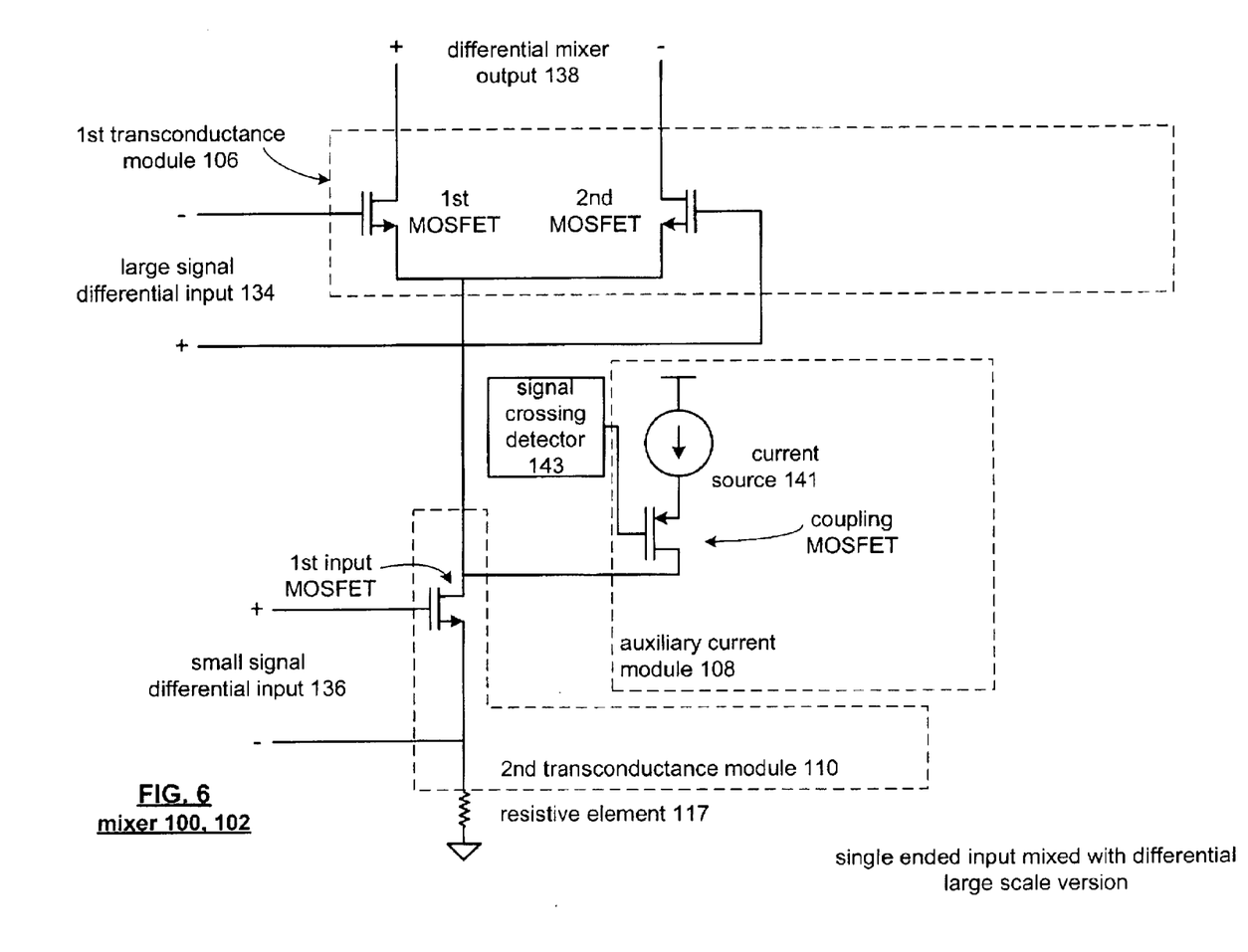
FIG. 6 is a schematic diagram of an alternate embodiment of a mixer.

FIG. 6 is a schematic diagram of an alternate embodiment of a mixer. In general, the schematic diagram of FIG. 6 includes a large signal differential input 134 for receiving a differential local oscillation but receives a single-ended input signal for mixing therewith the large signal differential input. The source terminals of a first and second MOSFET of a first tranconductance module 107 are coupled to the drain terminal of an input MOSFET of a second transconductance module 111. Because the input stage is single-ended, however, a resistive element 117 is included between the source terminal of the input MOSFET and circuit common. Accordingly, a small signal input 136 is applied only across the gate-to-source terminal of the input MOSFET. The resistive element 117 between the source terminal and circuit common is to avoid shorting the small signal input 136 to ground.

Current source 141, as before, is coupled to a source terminal of a coupling MOSFET. In the described embodiment, the drain terminal of the coupling MOSFET coupled to the drain terminal of the input MOSFET to provided current thereto. A gate terminal of the coupling MOSFET is coupled to a signal crossing detector 143. Signal crossing detector 143 generates a signal to the gate terminal of the coupling MOSFET whenever the large signal differential input approaches a zero crossing. Accordingly, as the large signal differential input 134 approaches a zero-crossing, the coupling MOSFET is operatively biased to source current from current source 141 into the drain terminal of the input MOSFET. As before, the small signal input 136 is biased to DC level to provide a continuous DC biased current for the first and second MOSFETs. Additionally, the amplified RF signal 130 is produced as an input signal if the mixer of FIG. 6 is used as a down-conversion mixer.

Figure 7:
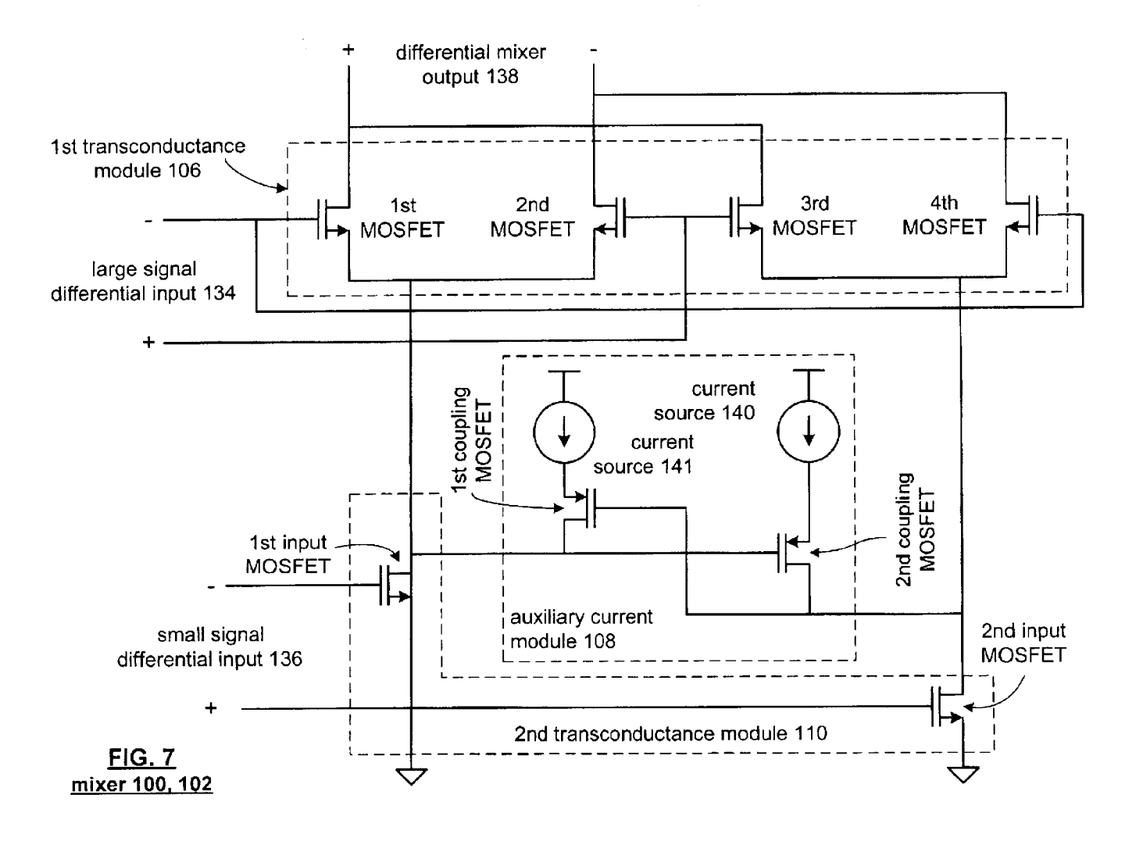
FIG. 7 is a functional schematic diagram of a mixer with two auxiliary current sources formed according to one embodiment of the present invention.

FIG. 7 is a functional schematic diagram of a mixer with two auxiliary current sources formed according to one embodiment of the present invention. In general, the schematic of FIG. 7 is similar to that of FIG. 4 and the operation thereof is similar with the exception of auxiliary current module 108. As may be seen, in contrasting FIG. 4 and FIG. 7, the auxiliary current module of FIG. 4 included but one current source 140 that was coupled to the source terminals of a pair of coupling MOSFETS, namely, the first and second coupling MOSFETs. Here in FIG. 7, however, two current sources are provided in which each current source is coupled to a source terminal of one of the two coupling MOSFETs. In the example shown, current source 141 is coupled to the source terminal of the first coupling MOSFET, while current source 142 is coupled to the source terminal of the second coupling MOSFET. Given the configuration of FIG. 7, each of the current sources 141 and 142 are formed to provide approximately half of the amount of current that is to be provided by current source 140 of FIG. 4. The reason for this, of course, is that current source 140 had to provide current for the drains of both the first and second input MOSFETs. Here, in FIG. 7, however, each of the current sources 141 and 142 provides drain current for only one of the first and second input MOSFETs and thus only half the amount of current is required by the current source 141 or 142.

The current sources 140 (of FIG. 4), 141, and 142 may be provided by a plurality of different elements. For example, the current sources may comprise a traditional current source as is understood by one of average skill in the art. However, the current sources may also be replaced merely by a transconductance element, such as a resistor or a MOSFET configured and biased to operate as a resistor, that is coupled to a voltage source. If a circuit is used in which the current source comprises a voltage source coupled to a resistive load or other element, the value of the resistive load would be one that produces half the amount of current for current sources 141 and 142 in contrast to current source 140 of FIG. 4.

Figure 8:
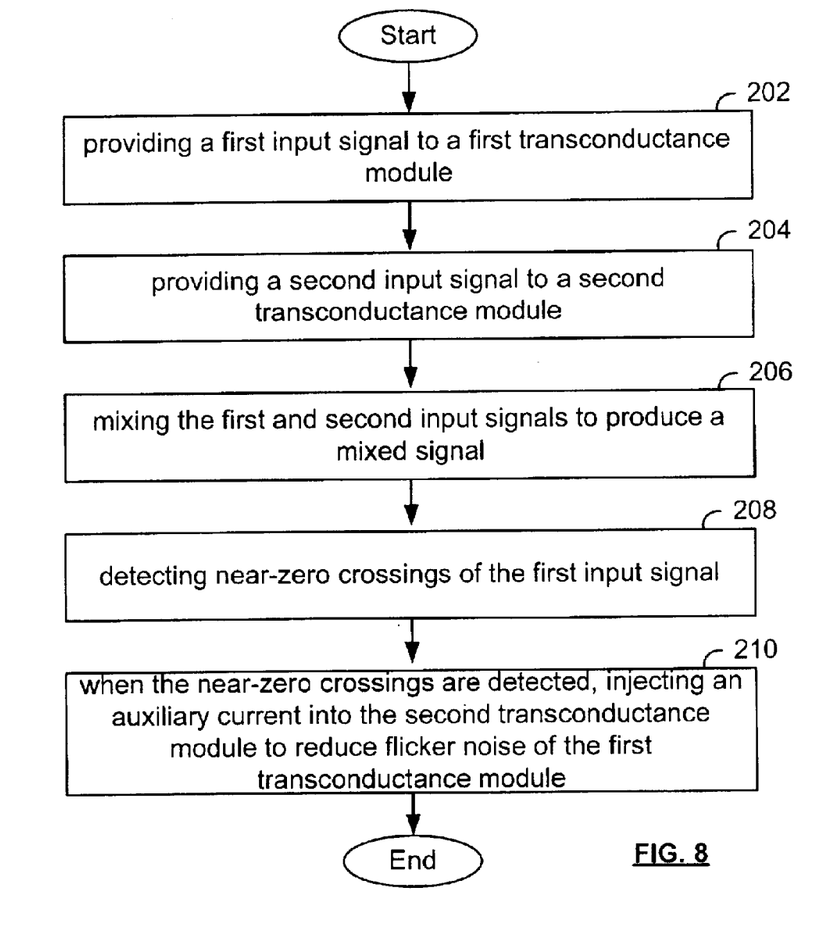
FIG. 8 is a flowchart that illustrates a first aspect of circuit operation according to the present invention.

FIG. 8 is a flowchart that illustrates a first aspect of circuit operation according to the present invention. Initially, a first input signal is provided to a first transconductance module (step 202). As described in the embodiments of the various schematics shown herein, including, without limitation, the schematics of FIGS. 3, 4 and 7, the first input signal is a large signal differential input that comprises either the differential I component of a local oscillation or the differential Q component of a local oscillation. The method of FIG. 8 also includes providing a second input signal to a second transconductance module (step 204). The second input signal is, in the described embodiment, a small signal input that may comprise, for example, an amplified RF signal if the mixer is being used as a down-converter.

The invention further includes mixing the first and second input signals to produce a mixed signal (step 206).

Additionally, the invention includes detecting a near-zero-crossing of the first input signal (step 208). The near-zero-crossing of the first input signal is also referred to as switching and relates specifically to switching of the first transconductance module elements. For example, switching includes transitioning from one-half of a signal cycle to a second half of a signal cycle for the differential inputs to the mixer wherein the switching relates to what circuit portion conducts the drain current. When a near-zero-crossing is detected, the inventive method includes injecting an auxiliary current into the second transconductance module to reduce flicker noise of the first transconductance module (step 210). Thus, as a switching point approaches, the amount of drain current that is conducted through transistors of the first transconductance module, as the current flow switches from one circuit portion to another circuit portion, is reduced and the current from the auxiliary current source is, during switching, mixed with the small signal input of the input MOSFET.

Figure 9:
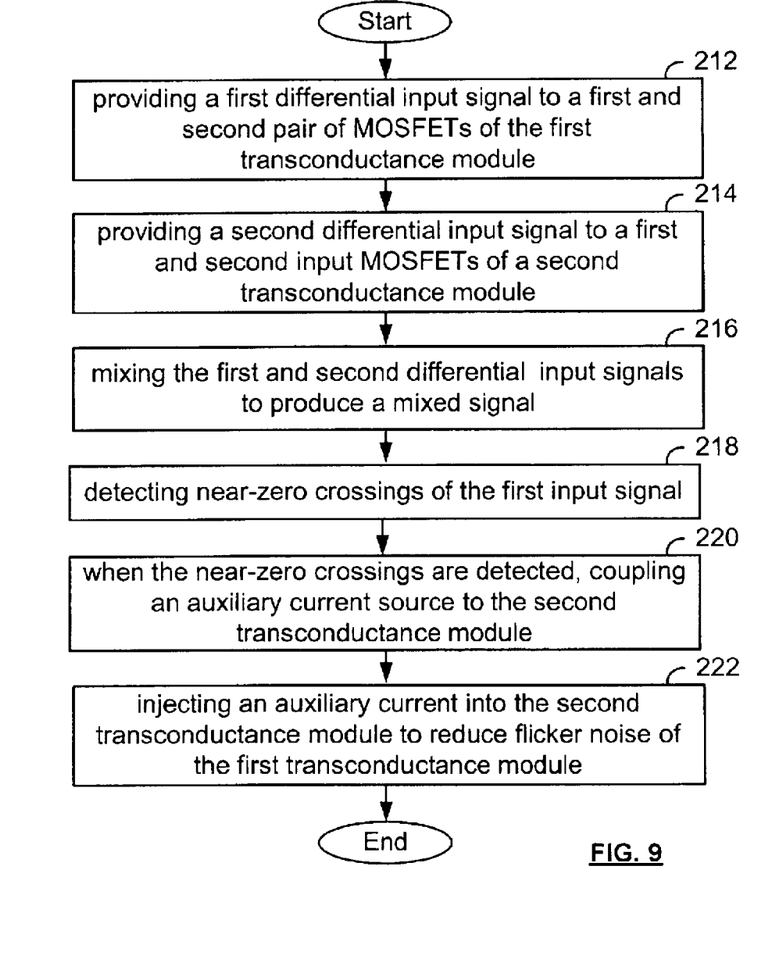
FIG. 9 is a flowchart illustrating a second aspect of circuit operation according to the present invention.

FIG. 9 is a flowchart illustrating a second aspect of circuit operation according to the present invention. The method of FIG. 9 includes providing a first differential input signal to a first and second pair of MOSFETs of a first transconductance module (step 212). The invention further includes providing a second differential input signal to first and second input MOSFETs of a second transconductance module (step 214). The invention further includes mixing the first and second differential input signals to produce a mixed signal (step 216). As before, the invention further includes detecting the near-zero-crossings of the first input signal (step 218). In one specific embodiment of the present invention, detecting the near-zero-crossing of the first input signal comprises operatively biasing an at least one coupling MOSFET to cause it to couple a current source to the terminal of an input MOSFET. Thus, when the near-zero crossings are detected, the invention includes coupling an auxiliary current source to the second transconductance module (step 220). When the auxiliary current source is coupled to the second transconductance module, an auxiliary current is injected into the second transconductance module to reduce flicker noise of the first transconductance module (step 222).

The invention disclosed herein is susceptible to various modifications and alternative forms. Specific embodiments therefore have been shown by way of example in the drawings and detailed description. It should be understood that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A mixer, comprising:

first and second MOSFETs having source terminals coupled together;

a first input MOSFET coupled to the source terminals of the first and second MOSFETs to operate as a first bias current sink for the first and second MOSFETs and coupled to receive a first leg of a small differential signal input;

third and fourth MOSFETs having source terminals coupled together wherein the drain terminals of the first and third MOSFETs are coupled together to provide a first leg of a differential output of the mixer and the drain terminals of the second and fourth MOSFETs are coupled together to provide a second leg of the differential output;

a second input MOSFET coupled to the source terminals of the third and fourth MOSFETs to operate as a second bias current sink for the third and fourth MOSFETs and coupled to receive a second leg of the small differential signal input;

wherein the first and fourth MOSFETs have gate terminals operatively coupled to receive a first leg of a large signal differential input;

wherein the second and third MOSFETs have gate terminals operatively coupled to receive a second leg of a large signal differential input;

at least one current source; and first and second coupling MOSFETs operably coupled to the at least one current source and to the first and second input MOSFETs, respectively, to substantially source the first and second bias currents when the large signal differential input approaches an alternating current zero-crossing point, the first and second coupling MOSFETs further coupled to receive, at a gate terminal of each of the first and second coupling MOSFETs, a signal from the source terminals of the third and fourth MOSFETs and the first and second MOSFETs, respectively, to operationally bias the first and second coupling MOSFETs.

2. The mixer of claim 1 wherein the at least one current source consists of one current source wherein the coupling circuitry couples the one current source to each of the first and second bias current sinks.

3. The mixer of claim 1 wherein the at least one current source comprises a resistor coupled to a supply voltage.

4. The mixer of claim 1 wherein the at least one current source comprises a MOSFET coupled and biased to act as a resistor coupled to a supply voltage.

5. The mixer of claim 1 wherein the at least one current source comprises two current sources for sourcing current approximately at a zero-crossing wherein a first of the two current sources substantially sources current for the first bias current sink and wherein a second of the two current sources substantially sources current for the second bias current sink.

6. The mixer of claim 5 wherein the at least one current source comprises two resistors coupled to a supply voltage.

7. The mixer of claim 5 wherein the at least one current source comprises two MOSFETs coupled and biased to act as resistors coupled to a supply voltage.

8. The mixer of claim 1 wherein the coupling circuitry comprises at least one coupling MOSFET.

9. The mixer of claim 8 wherein each MOSFET of the at least one coupling MOSFET comprises a p-channel MOSFET.

10. The mixer of claim 5 wherein the coupling circuitry comprises at least two p-channel coupling MOSFETs, each having a gate terminal coupled to receive a bias signal that operably biases the p-channel MOSFET as the large signal differential input approaches a zero-crossing.

* * * * *

UNITED STATES PATENT AND TRADEMARK OFFICE
CERTIFICATE OF CORRECTION

PATENT NO. : 6,889,037 B2  Page 1 of 1
APPLICATION NO. : 10/224039
DATED : May 3, 2005
INVENTOR(S) : Hooman Darabl

It is certified that error appears in the above-identified patent and that said Letters Patent is hereby corrected as shown below:

On the Title Page, Item (75), should read:

Inventor: Hooman Darabi, Long Beach, CA (US)

Signed and Sealed this

Eleventh Day of July, 2006

JON W. DUDAS
*Director of the United States Patent and Trademark Office*